(12) United States Patent  
Watanabe

(10) Patent No.: US 7,345,335 B2  
(45) Date of Patent: Mar. 18, 2008

(54) SEMICONDUCTOR INTEGRATED CIRCUIT, BOOSTER CIRCUITRY, AND NON-VOLATILE SEMICONDUCTOR MEMORY DEVICE

(75) Inventor: Yoshihisa Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 314 days.

(21) Appl. No.: 11/147,276

(22) Filed: Jun. 8, 2005

(65) Prior Publication Data

US 2005/0275004 A1 Dec. 15, 2005

(30) Foreign Application Priority Data

Jun. 9, 2004 (JP) ............... 2004-171584

(51) Int. Cl.
*H01L 29/76* (2006.01)
(52) U.S. Cl. ............ 257/314; 257/315; 257/316; 257/317; 257/324; 257/E27.078
(58) Field of Classification Search ......... 257/314, 257/315, 316, 317, 324
See application file for complete search history.

(56) References Cited

U.S. PATENT DOCUMENTS

| | | | | |
|---|---|---|---|---|
| 6,093,605 | A * | 7/2000 | Mang et al. | ......... 438/257 |
| 6,829,167 | B2 * | 12/2004 | Tu et al. | ......... 365/185.18 |
| 7,046,549 | B2 * | 5/2006 | Lee et al. | ......... 365/185.05 |
| 2002/0167047 | A1 | 11/2002 | Yasuhara et al. | |
| 2003/0031064 | A1 | 2/2003 | Natori | |

FOREIGN PATENT DOCUMENTS

| JP | 9-35499 | 2/1997 |
|---|---|---|
| JP | 2002-133898 | 5/2002 |
| JP | 2003-31805 | 1/2003 |
| JP | 2004-79036 | 3/2004 |

\* cited by examiner

*Primary Examiner*—Wai-Sing Louie  
(74) *Attorney, Agent, or Firm*—Oblon, Spivak, McClelland, Maier & Neustadt, P.C.

(57) ABSTRACT

In a capacitor-containing semiconductor integrated circuit, a portion in which a plurality of capacitors are serially connected together is arranged so that at least part of the capacitors is formed as a well capacitor.

9 Claims, 14 Drawing Sheets

SEMICONDUCTOR INTEGRATED CIRCUIT, BOOSTER CIRCUITRY, AND NON-VOLATILE SEMICONDUCTOR MEMORY DEVICE

CROSS-REFERENCE TO PRIOR APPLICATION

This application is based upon and claims the benefit of priority from the prior Japanese Patent Application No. 2004-171584, filed on Jun. 9, 2004, the entire content of which is incorporated herein by reference.

BACKGROUND OF THE INVENTION

1. Field of the Invention

The present invention relates to a capacitor-equipped semiconductor integrated circuit and also a non-volatile semiconductor memory device.

2. Description of the Related Art

In semiconductor memories such as NAND-type flash memories, capacitors are used in various types of peripheral circuits such as boosting circuits and sense amplifiers or the like. These capacitors are formed as MOS capacitors or well capacitors above a semiconductor substrate by the same process as that of transistors making up memory cells.

A MOS capacitor has a gate electrode that is formed through a gate insulation film on either a semiconductor substrate or a well and diffusion regions that are formed to sandwich the gate electrode therebetween. It is a capacitor in which an inversion layer is formed in a channel region by applying a voltage to the diffusion regions. It utilizes the capacitance between this inversion layer and the gate electrode.

A well capacitor is a capacitor that has a gate electrode formed via a gate insulation film above a well formed on a semiconductor substrate. An accumulation layer is formed immediately beneath the gate insulation film by applying a voltage to this well. A capacitance between this accumulation layer and the gate electrode is used as a capacitance.

In the case of forming these MOS and well capacitors as circuit elements in a semiconductor integrated circuit such as a NAND-type flash memory or else, there is a problem which follows. Parasitic capacitance takes place due to the presence of signal lines and/or wiring lines such as power supply lines passing over the capacitors or due to other factors, causing capacitor-containing circuitry to decrease in electrical characteristics.

SUMMARY OF THE INVENTION

A semiconductor integrated circuit in accordance with a first aspect of this invention is a capacitor-containing semiconductor integrated circuit, characterized in that at a portion at which a plurality of capacitors are serially connected, at least part of the capacitors is formed as a well capacitor.

A semiconductor integrated circuit in accordance with a second aspect of this invention is a semiconductor integrated circuit which includes a capacitor comprised of a semiconductor layer, a dielectric material layer formed above this semiconductor layer, and a gate electrode formed above this dielectric material layer, featured in that at least part of a plurality of series-connected capacitors is formed so that a wiring layer overlies and covers the gate electrode, the wiring layer being supplied with a signal switching between a first potential and a second potential.

A non-volatile semiconductor circuit in accordance with a third aspect of the invention is a non-volatile semiconductor memory device comprising a memory cell array with memory cells arranged therein, each memory cell having a floating gate formed on a semiconductor substrate of a first conductivity type via an interlayer dielectric film, and a control gate formed above said floating gate via an interlayer dielectric layer, and a booster circuit boosting a power source voltage to a certain boosted voltage, wherein said booster circuit comprises a well capacitor formed of a well of a second conductivity type formed at said semiconductor substrate of a first conductivity type, and a gate electrode formed on said well via a dielectric film, and wherein a wiring layer electrically connected to said well switched between a first potential and a second potential passes above said gate electrode.

DETAILED DESCRIPTION OF THE INVENTION

Embodiments of this invention will be explained with reference to the accompanying drawings below.

Figure 1:
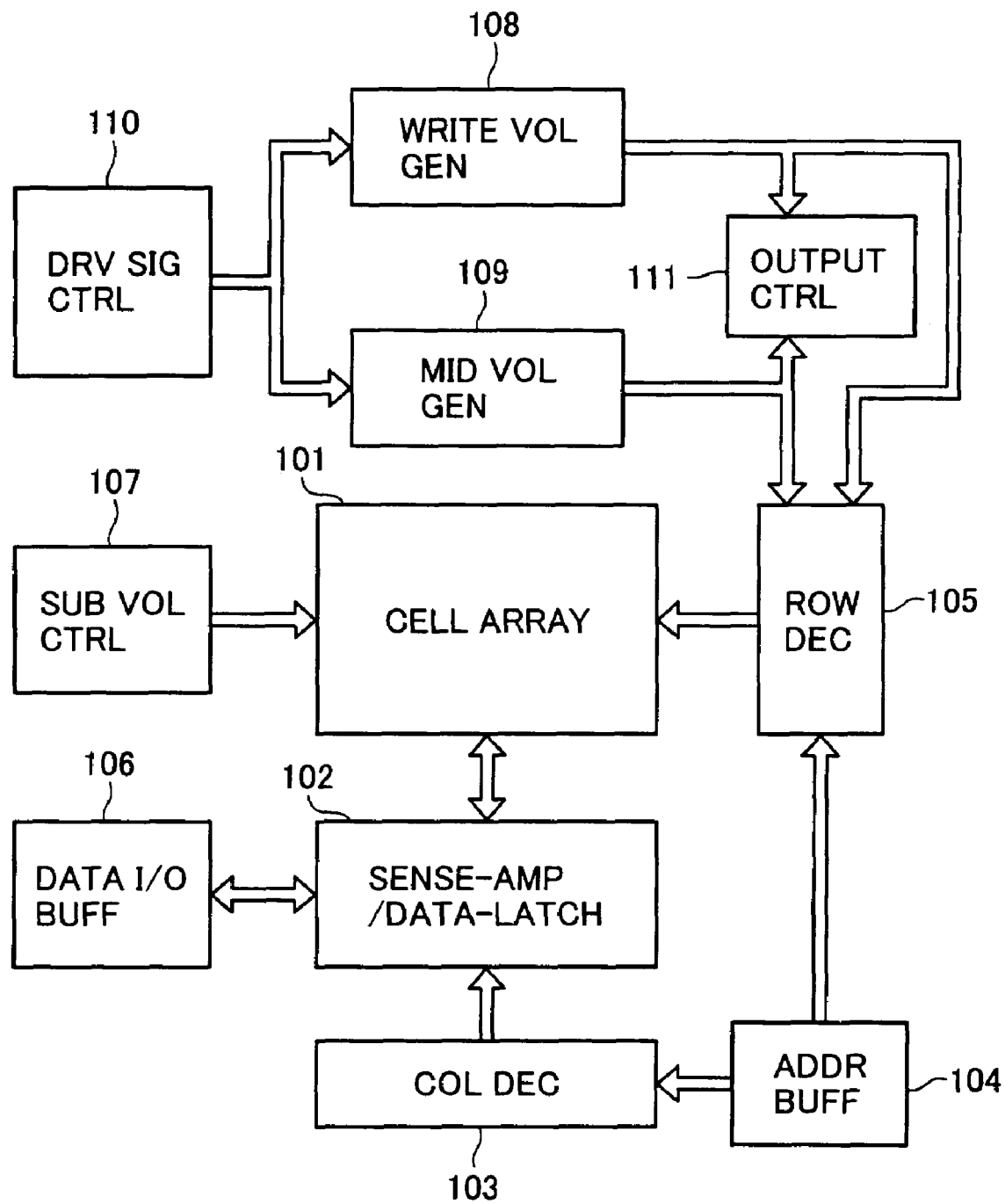
FIG. 1 shows a block arrangement of a NAND cell type EEPROM, to which an embodiment of this invention is applicable.

FIG. 1 shows a block configuration of a NAND cell type EEPROM, to which a first embodiment of the invention can be applied. A memory cell array 101 is arranged by layout of NAND cells each having nonvolatile memory cells being serially connected together, as will be described in detail later. A sense-amplifier/data-latch circuit 102 is provided for sensing bitline data of this memory cell array 101 or alternatively for retaining write data.

The sense-amp/data-latch 102 is connected to a data input/output buffer 106. Connection between the sense-amp/ data-latch 102 and data input/output buffer 106 is controlled by an output of a column decoder 103, which receives an address signal from an address buffer 104. A row decoder 105 is provided to perform memory cell selection with respect to the memory cell array 101—more practically, in order to control control gates and select gates. A substrate voltage control circuit 107 is provided to control the voltage potential of a P-type semiconductor substrate (or P-type well) in which the memory cell array 101 is formed.

A write voltage generation circuit 108 is provided to generate a write voltage that was potentially boosted from the power supply voltage in the event that data is written into a selected memory cell of the memory cell array 101. In addition to this write voltage generator circuit 108, an intermediate voltage generation circuit 109 is provided to generate an intermediate voltage which is to be given to non-selected memory cells during data writing. The intermediate voltage generator circuit 109 produces the intermediate voltage, which is boosted to have a potential level that is lower than the above-noted write voltage but higher than the power supply voltage.

A drive signal control circuit 110 is provided for control of these write voltage generator circuit 108 and intermediate voltage generator circuit 109. In addition, an output control circuit 111 is provided to perform control for causing an output of write voltage generator circuit 108 to follow and keep track of an output voltage of the intermediate voltage generator circuit 109 under specified conditions. To be more precise, this output control circuit 111 limits the maximum value of a difference between the output voltage of intermediate voltage generator circuit 109 and the output voltage of write voltage generator circuit 108 until the output voltage of intermediate voltage generator circuit 109 reaches a prespecified level and, thereafter, performs control for allowing the output voltage of write voltage generator circuit 108 to continue its potential rise-up in the state that the above-noted maximum value is not limited in any way.

Figure 2:
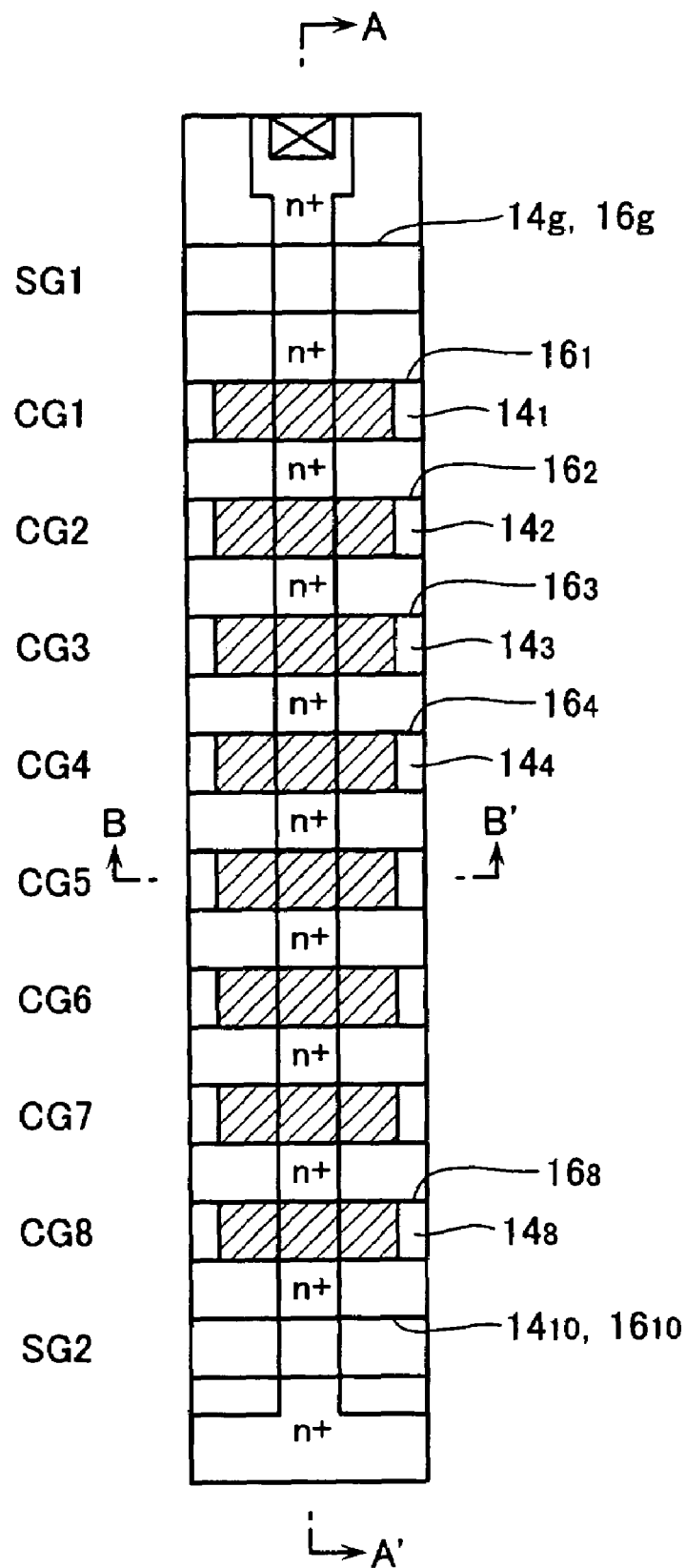
FIG. 2 is a plan view of a single NAND cell part of a memory cell array 101 of FIG. 1.
Figure 3:
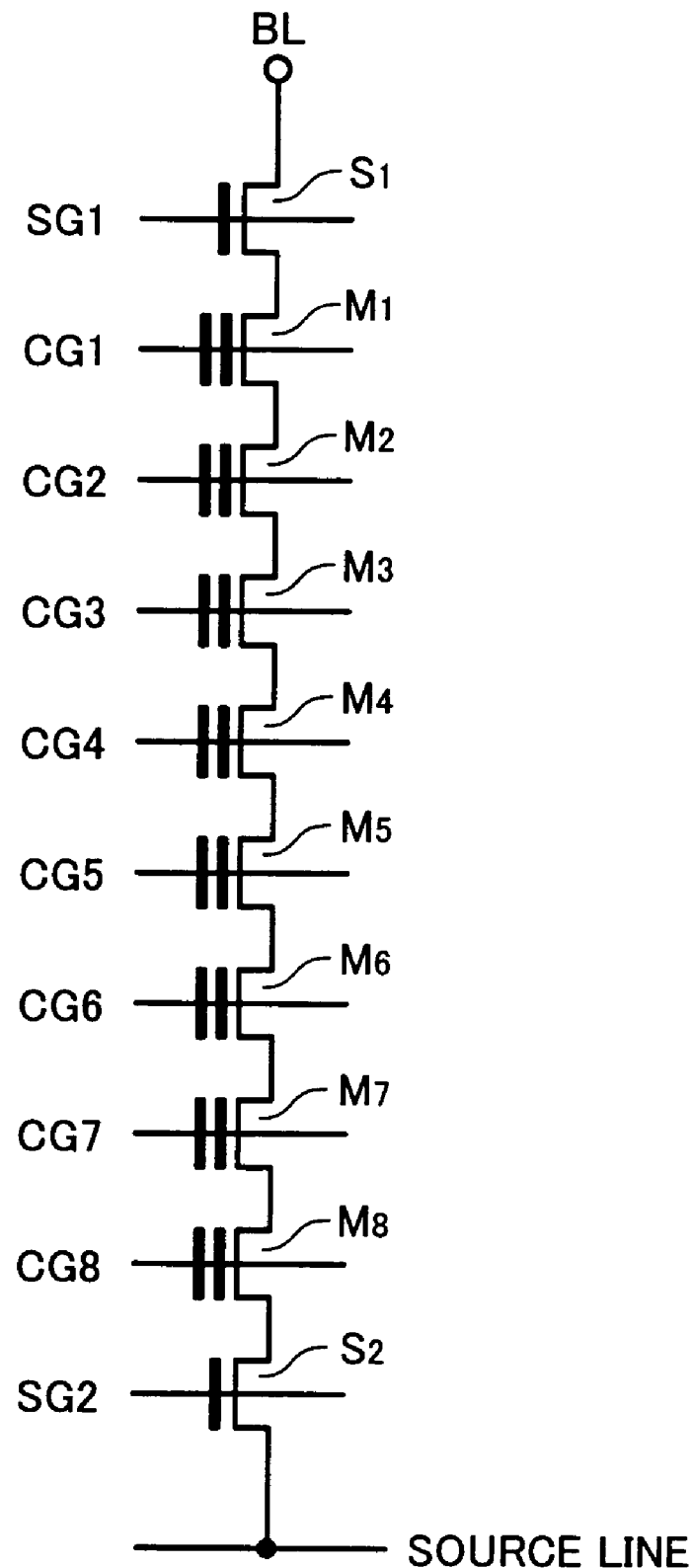
FIG. 3 is an equivalent circuit diagram of a NAND cell.
Figure 4:
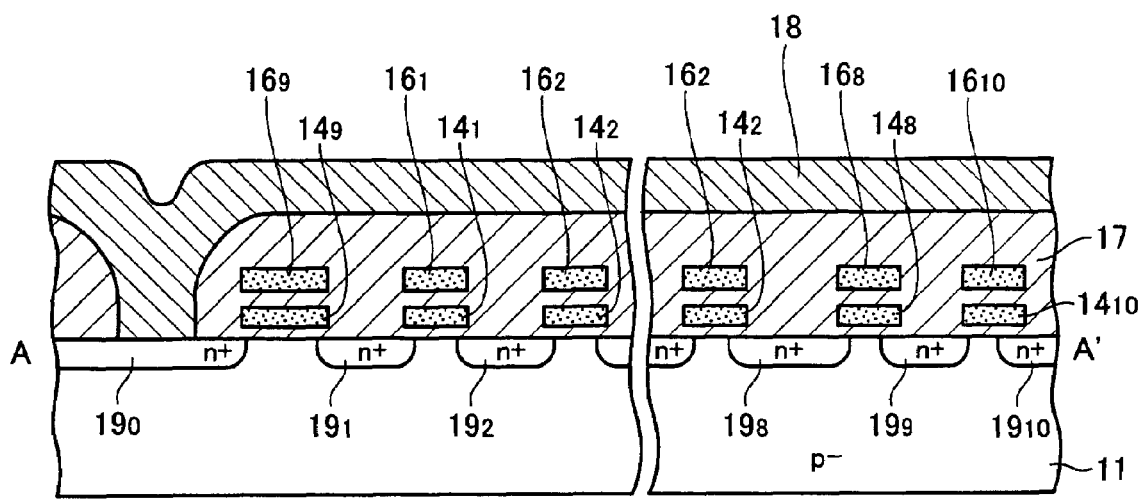
FIG. 4 is a cross-sectional view along line A-A' of FIG. 2.
Figure 5:
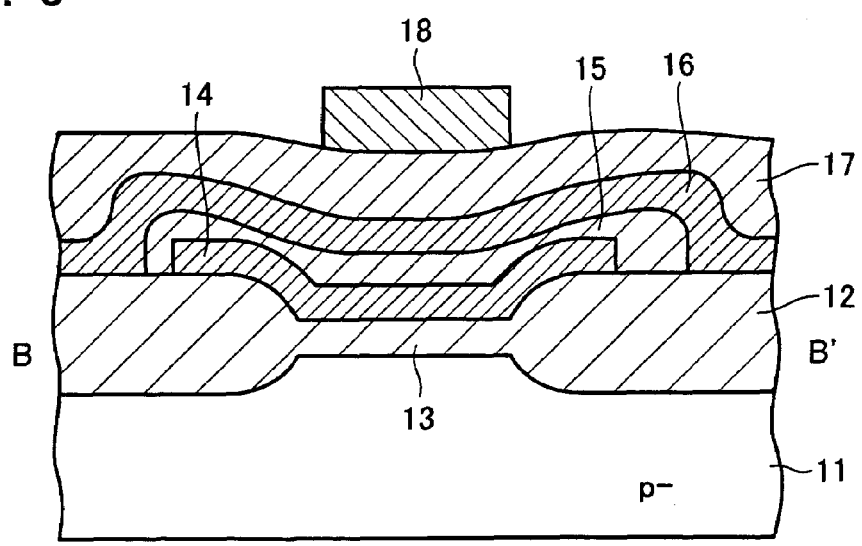
FIG. 5 is a B-B' sectional diagram of FIG. 2.

FIG. 2 is a plan view of a single NAND cell unit of the memory cell array 101, and FIG. 3 is an equivalent circuit diagram thereof. FIGS. 4 and 5 are cross-sectional views along line A-A' and B-B' of FIG. 2, respectively.

As shown in FIG. 5, the NAND cell is formed in a region that is surrounded by an element isolating dielectric film 12 of a p-type silicon substrate 11. Each memory cell is arranged so that a floating gate 14 ($14_1$, $14_2$, . . . , $14_8$) is formed via a gate insulation film 13 above the p-type semiconductor substrate 11, with a control gate 16 ($16_1$, $16_2$, . . . , $16_8$) being formed above the floating gate with an interlayer dielectric film 15 being laid therebetween. As an example, this floating gate 14 may be arranged to have a two-layer structure whose lower layer is a poly-silicon layer and whose upper layer is made of tungsten silicide (WSi), with a total thickness thereof being set at about 185 nm. The interlayer dielectric film 15 may be formed of accumulated layers including a silicon oxide layer, a silicon nitride layer, a silicon oxide layer, namely, an ONO layer. N-type diffusion layers 19 ($19_0$, $19_1$, . . . , $19_{10}$) that are source and drain diffusion layers of these memory cells are connected in the form that neighboring ones are shared, whereby the NAND cell is constituted.

Select gates $14_9$, $16_9$ and $14_{10}$, $16_{10}$, which were formed simultaneously during formation of the floating gates and control gates of the memory cells, are provided on the drain and source sides of NAND cell respectively. The element-formed substrate has its top surface that is covered with a CVD oxide film 17, on which bit lines 18 are disposed and provided. A bit line 18 is arranged to be in contact with a drain-side diffusion layer 19, which is at one end of the NAND cell. Control gates 14 of the NAND cell which are aligned in a row direction are provided in common as control gate lines CG1, CG2, . . . , CG8, each of which becomes a word line. The select gates $14_9$, $16_9$ and $14_{10}$, $16_{10}$ also are continuously provided in the row direction and thus become select gate lines SG1, SG2.

Figure 6:
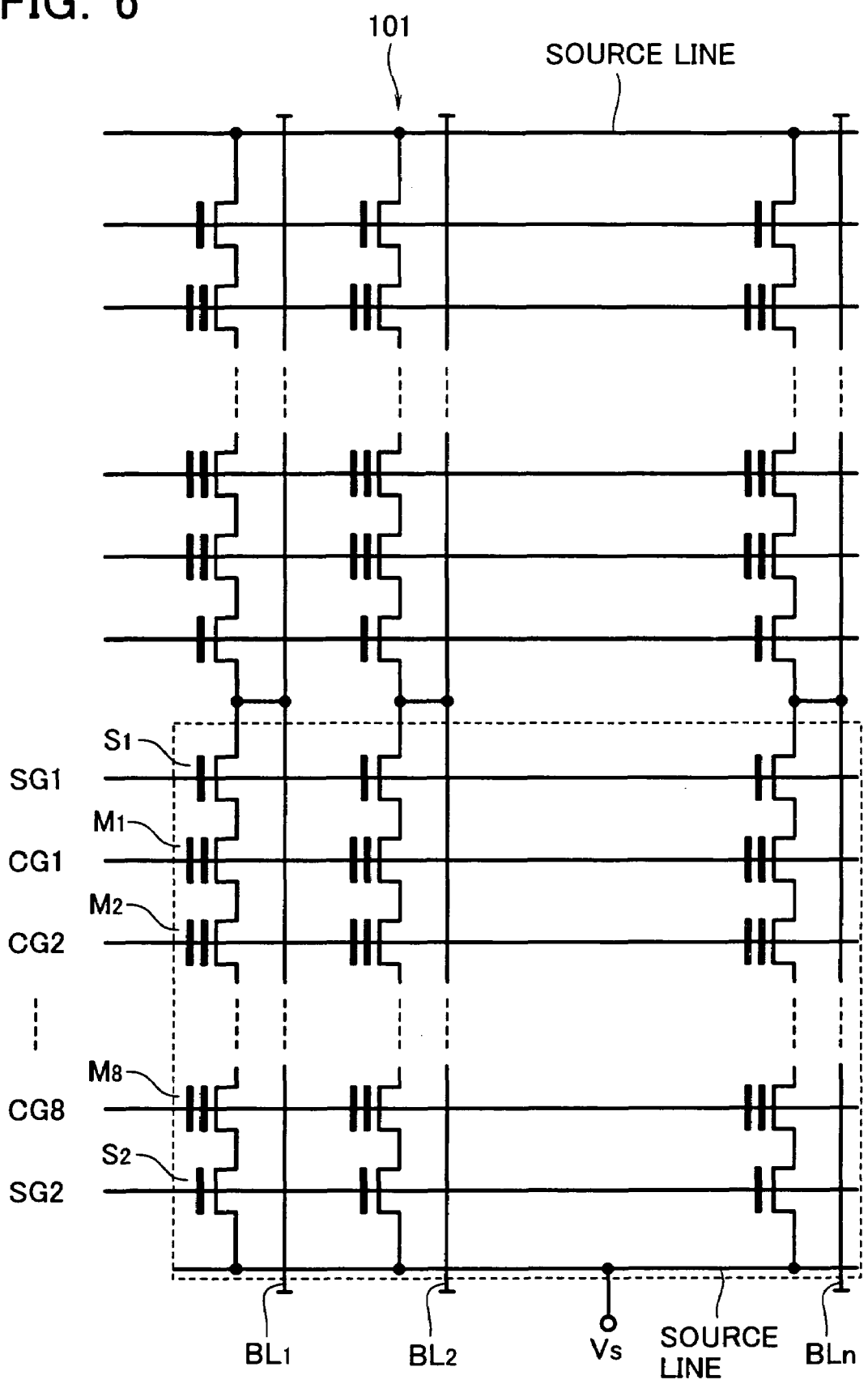
FIG. 6 is an equivalent circuit diagram of the memory cell array 101.

FIG. 6 shows an equivalent circuit of the memory cell array 101 in which such the NAND cells are laid out in a matrix form. A group of NAND cells which reside within a range surrounded by broken lines and which share the same control gate line (word line) and select gate line will be called a block. Typically, read and write operations are performed by selecting one from among a plurality of blocks.

Figure 7:
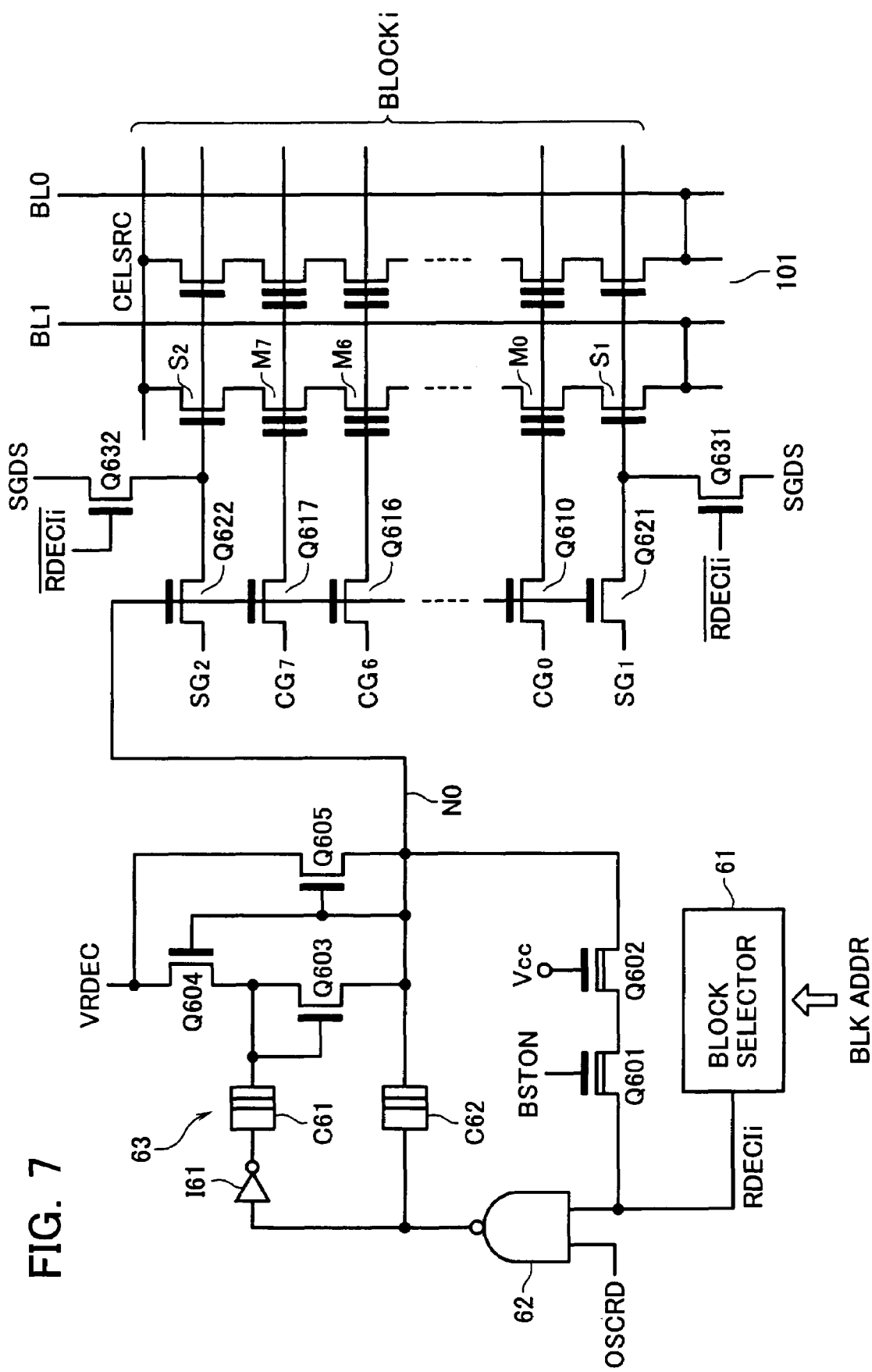
FIG. 7 is a configuration of a wordline control circuit unit of a row decoder 105, which is for a block "i" of the memory cell array 101.

FIG. 7 depicts a configuration of a portion of the row decoder 105, which is a word-line control circuit unit of a block i of the memory cell array 101. Upon entry of a block address, an output RDECLi of block select circuit 61 becomes "H," causing this block i to be selected. This block select output RDECIi is transferred to a node N0 by way of D-type NMOS transistors Q601, Q602, having gates which are controlled by a control signal BSTON and a power supply voltage VCC, respectively. E-type NMOS transistors Q610-Q617, Q621, Q622 that are driven by this node N0 are driver transistors for driving control gate lines (word lines) CG0-CG7 and select gates SG1, SG2 of the selected block i, respectively.

A portion which includes E-type NMOS transistors Q604, Q605 and an I-type NMOS transistor Q603 along with capacitors C61, C62 and an inverter 161 makes up a switch circuit 63 which utilizes charge pump actions for transferring to the node N0 a write voltage VRDEC that is obtained and generated from a booster circuit. The capacitors C61, C62 are MOS capacitors using D-type NMOS transistors. When the block i is selected resulting in transfer of "H" to the node N0, the NMOS transistor Q604 that has its drain provided with the write voltage VRDEC turns on, causing the write voltage to be sent to the node N0 by way of this NMOS transistor Q604 and the NMOS transistor Q603 that is diode-coupled.

The charge pump action is controlled by a NAND gate 62, to which the block select output RDECIi and an AC signal OSCRD are input. More specifically, when the block select signal RDECi is at "H," the AC signal OSCRD appears at the output of the NAND gate 62. Using this AC signal OSCRD, charge pumping is carried out at a portion which includes the capacitors C61, C62 that are mutually reverse-phase driven and the NMOS transistor Q603. As a result of this, the write voltage VRDEC is to be sent forth toward the node N0 without having to accompany with a potential drop, which is equivalent to the threshold voltage of MOS transistor Q603, Q604. Owing to the charge pump action, the node N0 is capable of rising up to a higher voltage than VRDEC—that is, VRDEC+a. However, the NMOS transistor Q605 suppresses this node N0's voltage rise-up. More specifically, while letting the threshold voltage of NMOS transistor Q605 be Vth, the voltage of node N0 is suppressed to VRDEC+Vth or less.

The E-type MOS transistors Q631, Q632 that are controlled by an inverted signal of the block select signal RDECIi are provided in order to set each of the select gate lines SG1, SG2 at ground potential SGDS when this block i is not selected—i.e., non-selected—during write and read sessions. In this embodiment, two bit lines share a single sense amplifier.

Figure 8:
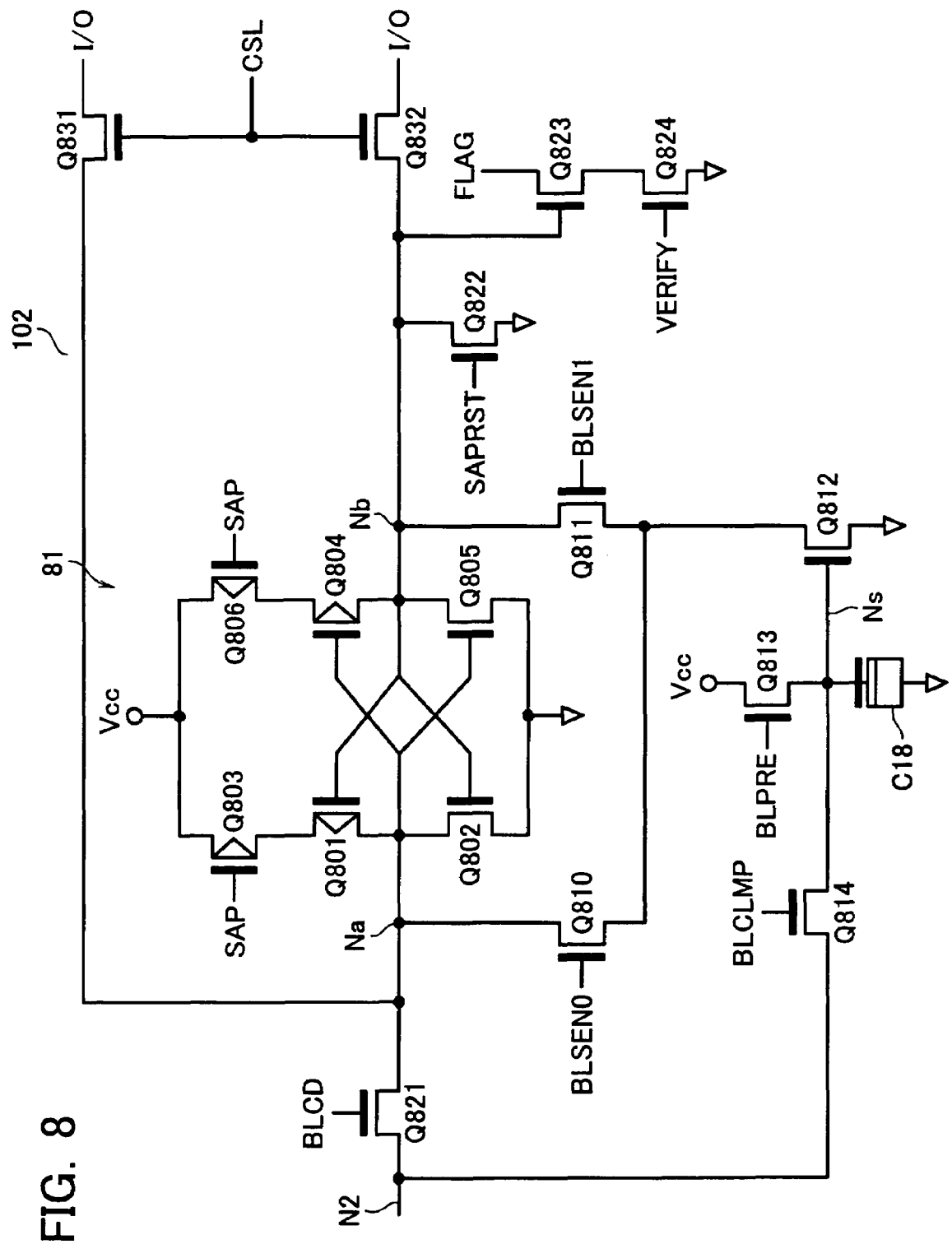
FIG. 8 shows a detailed configuration of a data-latch/sense-amplifier circuit 102.

FIG. 8 shows a detailed configuration of the data-latch/sense-amplifier circuit 102. Main part of a sense amp circuit is a latch 81 which is constituted by cross-coupling of input/output nodes of a CMOS inverter that is made up of a PMOS transistor Q801 and an NMOS transistor Q802 and also a CMOS inverter made up of a PMOS transistor Q804 and an NMOS transistor Q805. The sources of the PMOS transistors Q801, Q804 are connected to VCC via PMOS transistors Q803, Q806 for the activation use.

Two nodes Na, Nb of the latch 81 are respectively connected to data lines via NMOS transistors Q831, Q832, which are driven by a column select signal CSL. The nodes Na, Nb are also connected to the drain of a sense-use NMOS transistor Q812 by way of NMOS transistors Q810, Q811 that are controlled by data sense control signals BLSEN0, BLSEN1, respectively. The sense-use NMOS transistor Q812 has its gate which is a sense node Ns. This sense node Ns is connected to a bitline-connected node N2 via an NMOS transistor Q814 that is controlled by a control signal BLCLMP. The node N2 and the node Na of latch 81 are connected by an NMOS transistor Q821 which is controlled by a control signal BLCD.

Provided at the sense node Ns are a capacitor C81 for the data storage use and an NMOS transistor Q813 for precharge use. An NMOS transistor Q822 that is connected to the node Nb of latch 81 is for reset use. To the node Nb, the gate of an NMOS transistor Q823 is connected, which is controlled to turn on and off by "H," "L" of node Nb for verify-read purposes. The drain of NMOS transistor Q823 becomes a FLAG terminal that becomes "H" in verify-read events, whereas the source of it is grounded via an NMOS transistor Q824 which is switched by a verify control signal VERFY.

Figure 9:
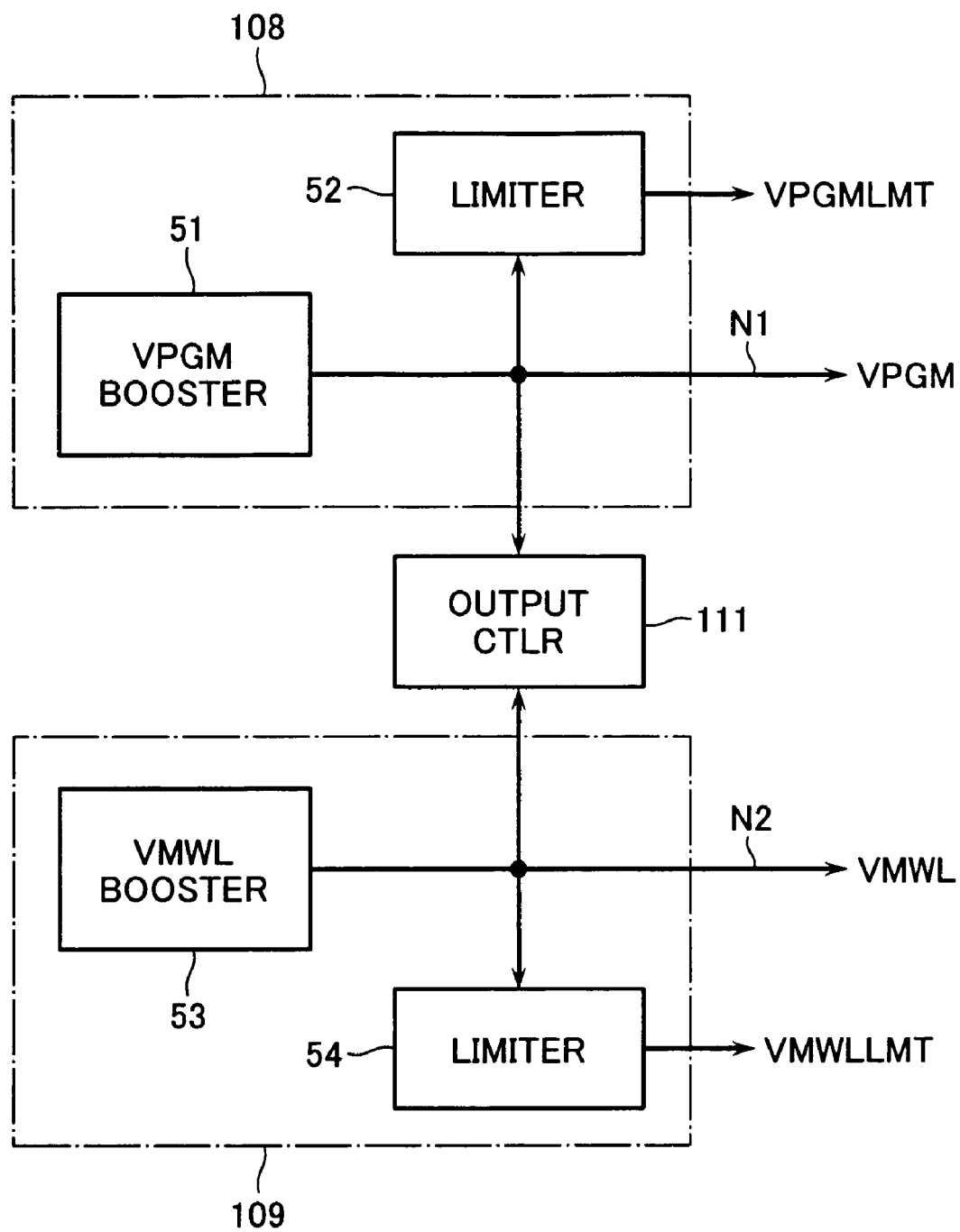
FIG. 9 shows a configuration of a write voltage generating circuit 108 and that of an intermediate voltage generation circuit 109 in FIG. 1.

FIG. 9 shows a configuration of the write voltage generator circuit 108 and that of the intermediate voltage generator circuit 109 in FIG. 1. The write voltage generator circuit 108 has a VPGM booster circuit 51 for obtaining a write-use high voltage VPGM from the power supply voltage VCC. Similarly the intermediate voltage generator circuit 109 has a VMWL booster circuit 53 for obtaining an intermediate or "mid" voltage VMWL, which is given to non-selected word lines during writing. An output control circuit 111, which is connected between the output node N1 of the VPGM booster circuit 51 and the output node N2 of VMWL booster circuit 53, is operable to control the short-circuiting and open-circuiting between these output nodes N1, N2 under certain conditions.

A limit circuit 52 is provided at the output of VPGM booster circuit 51, for setting its upper limit and for outputting a limit signal VPGMLMT when it becomes the upper limit. Also at the output of VMWL booster circuit 53, a limit circuit 54 is provided for setup of its upper limit and for output of a limit signal VMWLLMT.

Figure 10:
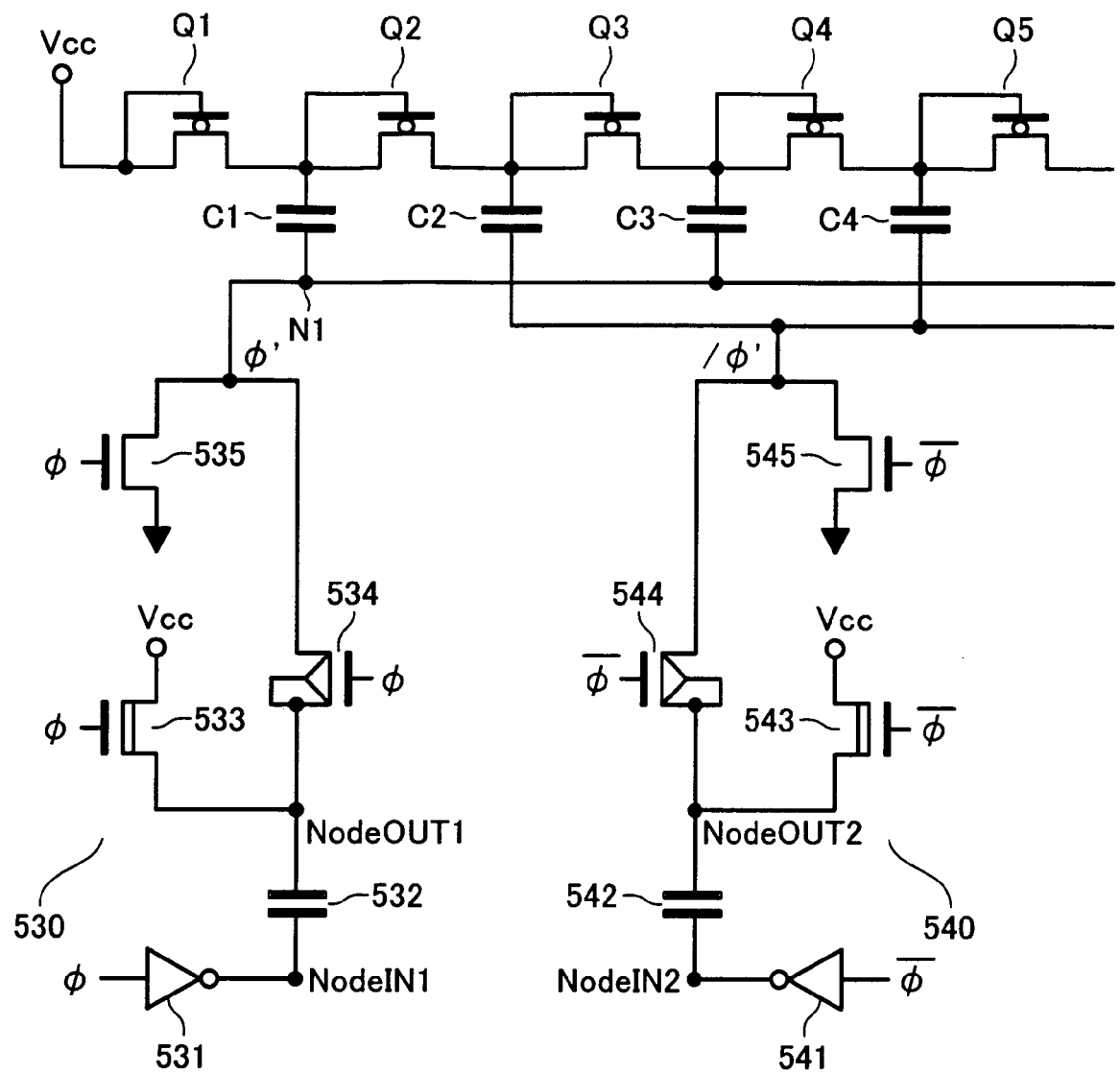
FIG. 10 shows detailed configurations of a VPGM booster circuit 51 and a VMWL booster circuit 53.

The VPGM booster circuit 51 and VMWL booster circuit 53 are each implemented as a booster circuit such as shown in FIG. 10. This booster circuit is a charge pump circuit with one end of each stage of capacitors C1-C4 being connected to each stage of diode-coupled charge transfer NMOS transistors Q1-Q5 and with the other end connected to a drive clock supply circuit 530 or 540. The other ends of capacitors C1 and C3 are connected to the drive clock supply circuit 530, while the other ends of capacitors C2 and C4 are coupled to the drive clock supply circuit 540.

The drive clock supply circuits 530 and 540 amplify the amplitude of an original clock signal φ and then supply it to the other ends of capacitors C1-C4, thereby making it possible to obtain a large boosted voltage with the use of a less number of stages. The drive clock supply circuit 530 has an inverter 531, a capacitor 532, a D-type NMOS transistor 533, a PMOS transistor 534, and an E-type NMOS transistor 535. The inverter 531 receives as its input signal a clock signal φ of amplitude Vcc (the voltage at the time of "H" is Vcc, the voltage of "L" is 0) and outputs an inverted signal /φ. An output terminal of the inverter 531 is connected to one terminal nodeIN1 of the capacitor 532.

The other terminal nodeOUT1 of the capacitor 532 is connected to a source terminal of the D-type NMOS transistor 533. The D-type NMOS transistor 533 is conduction-controlled with the clock signal φ being used as a gate signal. When it is rendered conductive, the potential of the terminal nodeOUT is forced to stay at the power supply voltage VCC. Similarly the PMOS transistor 534 is conduction-controlled with the clock signal φ as its gate signal. When the clock signal φ is at "L," the potential of the terminal nodeOUT1 is forced to be supplied to the other ends of capacitors C1 and C3. The NMOS transistor 535 is conduction-controlled with the clock signal φ as its gate signal in such a way as to force the capacitors C1 and C3 to potentially drop down at ground potential when φ is at "H." With this operation, the amplitude of a clock signal φ' being given to the other ends of capacitors C1 and C3 theoretically becomes equal to 2Vcc which is two times greater than that of the original clock signal φ (the voltage at the time of "H" is 2Vcc, the voltage of "L" is 0).

The drive clock supply circuit 540 has an inverter 541, a capacitor 542, a D-type NMOS transistor 543, a PMOS transistor 544 and an E-type NMOS transistor 545, and is almost similar in structure and function to the drive clock supply circuit 530.

In more detail, the inverter 541 receives as an input signal a clock signal /φ with its amplitude Vcc and then outputs an inverted signal φ thereof. An output terminal of the inverter 541 is connected to one terminal nodeIN2 of the capacitor 542.

The other terminal nodeOUT2 of the capacitor 542 is connected to a source terminal of the D-type NMOS transistor 543. The D-type NMOS transistor 543 is conduction-controlled with the clock signal /φ being used as a gate signal. When conducted, the potential of the terminal nodeOUT2 is forced to stay at the power supply voltage VCC. Similarly the PMOS transistor 544 is conduction-controlled with the clock signal /φ as its gate signal. When the clock signal /φ is "L," the potential of the terminal nodeOUT2 is supplied to the other ends of the capacitors C2 and C4. The NMOS transistor 545 is conduction-controlled with the clock signal /φ as its gate signal in such a way as to force the capacitors C2 and C4 to potentially drop down at ground potential when /φ is "H." With this operation, the amplitude of a clock signal /φ' being given to the other ends of capacitors C2 and C4 becomes 2Vcc which is two times greater than that of the original clock signal /φ.

In the drive clock supply circuit 530, 540 shown in FIG. 10, only one capacitor 532 or 542 is provided. However, an actually implemented drive clock supply circuit is such that a serial combination of several stages of capacitors each equivalent to the capacitor 532, 542 is employable in some cases in order to increase the gain of amplification of the clock signal φ. In such case, it will possibly happen that the amplitude of a clock signal being finally output from the drive clock supply circuit 530, 540 becomes lower than a theoretical value, due to accumulation of influences of parasitic capacitance components of respective ones of the series-connected capacitors.

Figure 11:
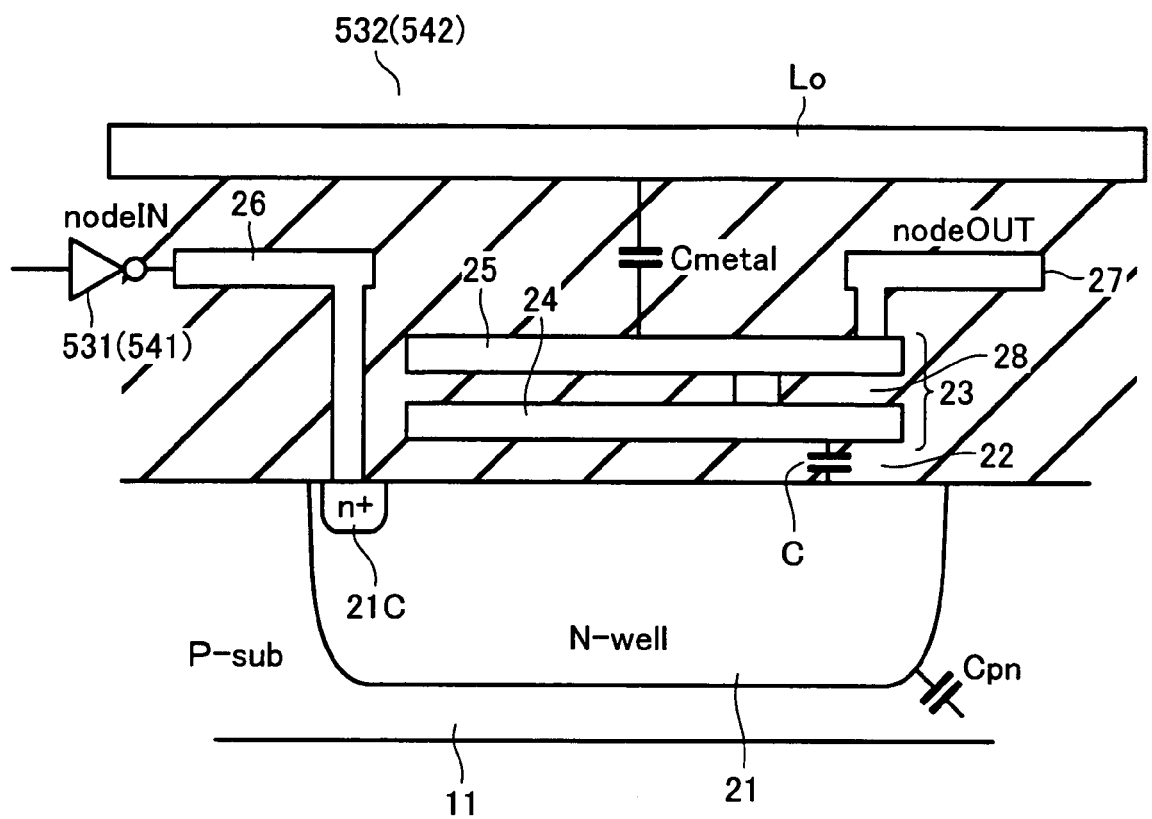
FIG. 11 shows a structure of an N-well capacitor for use as a capacitor 532, 542.

To avoid this, this embodiment is arranged to utilize N-well capacitors shown in FIG. 11, rather than MOS capacitors, as the capacitors C1-C4 and several stages of capacitors 532 and 542. Note however that the first stage of capacitor (i.e., the capacitor that directly receives the output of the inverter 531, 542) of the capacitors 532, 542 which are provided to span several stages is not necessarily a well capacitor and may alternatively be designed to use a MOS capacitor.

As shown in FIG. 11, the capacitors 532 and 542 that are formed of N-well capacitors are arranged so that each has an n-type well region 21 formed in a surface portion of the p-type semiconductor substrate 11, and also has a gate electrode 23 which is formed above this n-type well 21 via a gate insulation film 22 with its thickness of about 20 nm.

In a similar way to the floating gates 14 of the memory cells shown in FIGS. 4-5, the gate electrode 23 may be designed to have a multilayer structure with a thickness of about 185 nm while letting a lower layer be a polysilicon layer 24 and also letting an upper layer be a tungsten silicide layer 25, by way of example. As shown in FIG. 11, an interlayer dielectric film 28 may be interposed between the polysilicon layer 24 and the tungsten silicide layer 25. Furthermore, the polysilicon layer 24 and the tungsten silicide layer 25 may be electrically connected by making a contact hole at one part of the interlayer dielectric film 28.

A first wiring layer 26 is connected to the n-type well 21 through a contact layer 21C. Via this first wiring layer 26, the clock signal φ or φ is supplied from the inverter 531 or 541. Applying a voltage to the n-type well 21 results in formation of a accumulation layer immediately beneath the gate insulator film 22. A capacitance C of the capacitor 532 or 542 is thus formed between this accumulation layer and the gate electrode 23.

Figure 12:
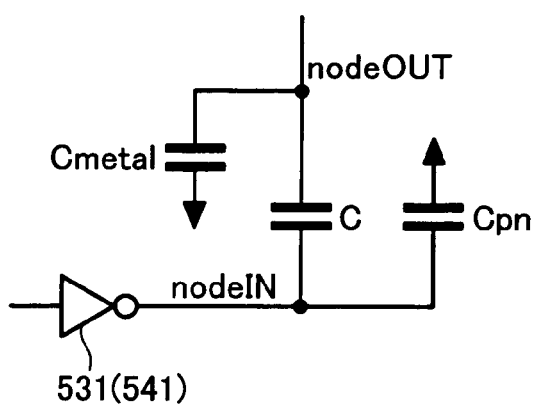
FIG. 12 shows an equivalent circuit diagram of FIG. 11.

As shown in an equivalent circuit diagram of FIG. 12, some major parasitic capacitance components occurring at these N-well capacitors are a parasitic capacitance Cmetal that takes place between the gate electrode 23 and an external wiring line Lo, such as a power supply line, and a parasitic capacitance Cpn occurring between the n-type well 21 and the p-type semiconductor substrate 11. Since the p-type semiconductor substrate 11 is grounded, parasitic capacitance Cpn becomes a capacitor component that is connected between the terminal nodeIN and ground potential.

Figure 13:
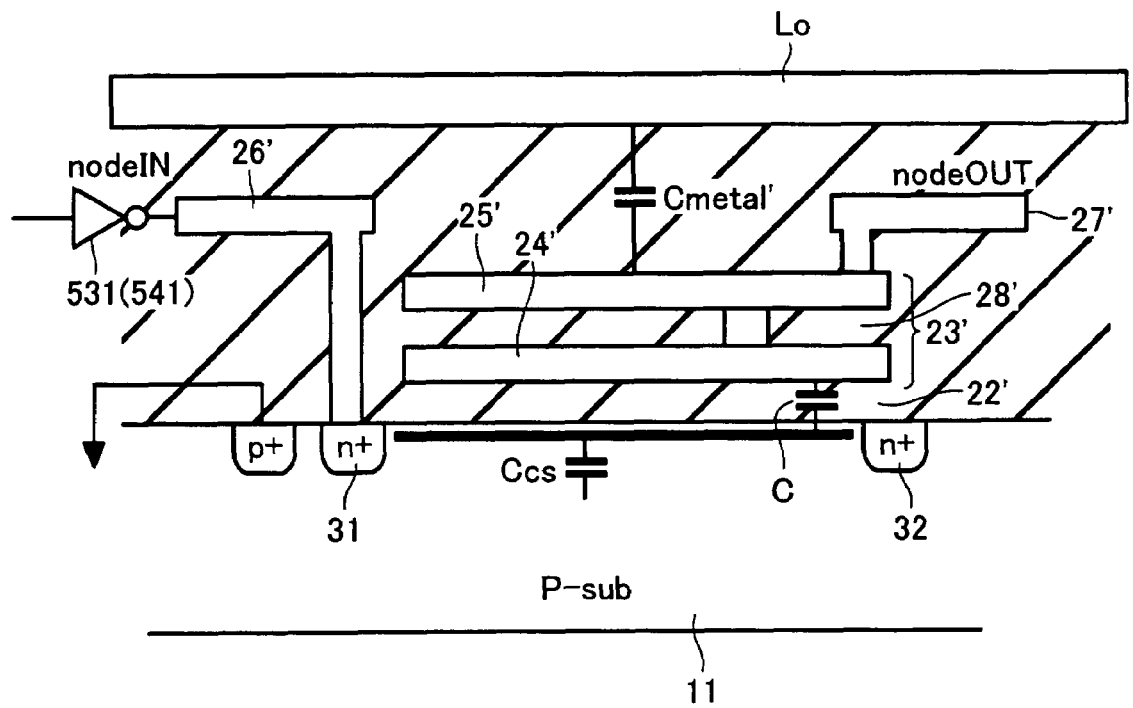
FIG. 13 shows a structure of a MOS capacitor for use as the capacitor 532, 542.

For comparison purposes, there is shown in FIG. 13 a case where a MOS capacitor is utilized as the capacitor 532, 542. As shown in FIG. 13, the MOS capacitor has a gate electrode 23' which is formed above a p-type semiconductor substrate 11 (or well) via a gate insulation film 22' and n-type diffusion regions 31 and 32 which are formed to interpose the gate electrode 23'. The gate electrode 23' may be designed to have a polysilicon layer 24' and be a tungsten silicide layer 25'. An interlayer dielectric film 28' may be interposed between the polysilicon layer 24' and the tungsten silicide layer 25'. Furthermore, the polysilicon layer 24' and the tungsten silicide layer 25' may be electrically connected by making a contact hole at one part of the interlayer dielectric film 28'.

By applying a voltage to these n-type diffusion regions 31 and 32 from a first wiring layer 26', an inversion layer is formed in a channel region immediately beneath the gate insulator film 22', thereby forming the capacitance C between this inversion layer and the gate electrode 22'.

Figure 14:
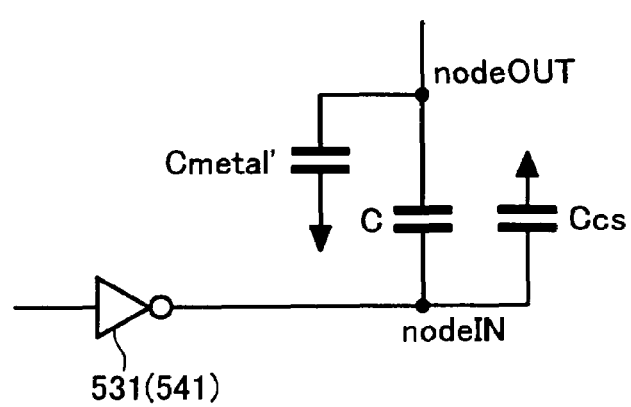
FIG. 14 shows an equivalent circuit diagram of FIG. 13.

As shown in an equivalent circuit diagram of FIG. 14, some major parasitic capacitances occurring at this MOS capacitor are a parasitic capacitance Cmetal' occurring between the gate electrode and an external wiring line Lo, such as a power supply line or else, and a parasitic capacitance Ccs occurring between the inversion layer of the channel region and the p-type semiconductor substrate 11. The parasitic capacitance Ccs becomes a capacitance component that is connected between the terminal nodeIN and ground potential in a similar way to the case of Cpn.

The parasitic capacitance Cmetal and parasitic capacitance Cmetal' are substantially the same in size as each other if the size of the gate electrode 23 or the like is the same. On the contrary, the parasitic capacitance Ccs is much larger than the parasitic capacitance Cpn. Due to this, when utilizing MOS capacitors as the capacitors C1-C4 and the plurality of series-connected capacitors 532, 542 (except for the initial-stage capacitor), there is a risk that the influence on an output of booster circuitry becomes larger. To avoid this, in this embodiment, these capacitors are constituted from well capacitors. Using the well capacitors makes it possible to reduce any waste power consumption at each capacitor and also to reduce the ratio of a decrease in amplitude of the clock signal that is output from the drive clock supply circuit 530, 540.

On the other hand, some capacitors such as for example the capacitors C61 and C62 in the raw decoder 105 and the capacitor C81 in the sense-amp/data-latch 102 are not series-connected together and are inherently less in capacitance. Thus, it is preferable to use NMOS capacitors that are simple in structure as shown in FIG. 13.

An explanation will next be given of a second embodiment of this invention with reference to FIGS. 15 and 16.

Figure 15:
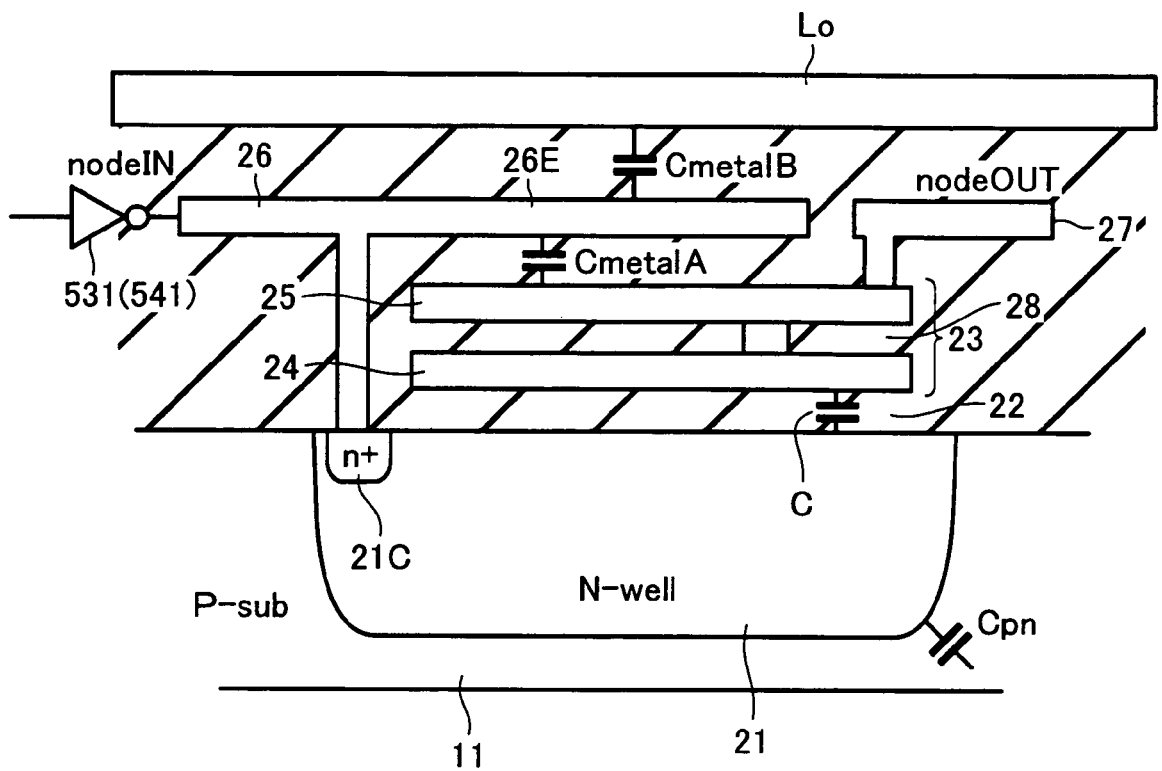
FIG. 15 shows a detailed structure of a capacitor in accordance with a second embodiment.
Figure 16:
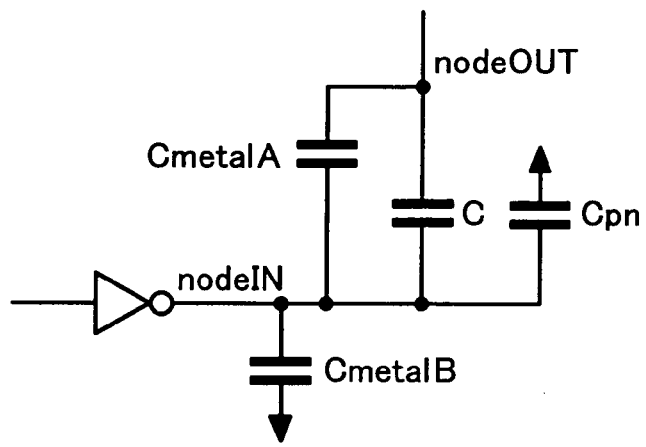
FIG. 16 is an equivalent circuit diagram of FIG. 15.

In FIGS. 15-16, certain parts or components which are similar to those of the first embodiment are added the same reference characters, and a detailed explanation will be omitted.

This embodiment is similar to the first embodiment in that well capacitors are employed for those capacitors that are series-connected with the other capacitors, such as the capacitors 532, 542 in the booster circuits. However, this embodiment is different from the first embodiment in that the first wiring layer 26 has an extending portion 26E which was formed to overlie and cover the gate electrode 23 as shown in FIG. 15.

In the case of the first embodiment, the parasitic capacitance Cmetal takes place between the terminal nodeOUT and ground potential. In the absence of such parasitic capacitance Cmetal, when an input signal of the terminal nodeIN is caused to change from "L" to "H" (Vcc), the terminal nodeOUT potentially rises by capacitive coupling from VCC up to 2×VCC. However, under the circumstance that the parasitic capacitance Cmetal exists, even when the input signal of terminal nodeIN is changed from "L" to "H," the potential level of the terminal nodeOUT hardly rises up to 2×VCC and stays at VCC+C·Vcc/(C+Cmetal) or below. This is because when the terminal nodeOUT increases in potential, electrical charge is further stored in the parasitic capacitance Cmetal, and this poses a bar to the potential rise-up of the terminal nodeOUT. As this parasitic capacitance Cmetal is less in value, an error per stage of booster circuit is small. However, if the booster circuits increase in stage number, then it will possibly occur that appreciable errors take place in a final boosted voltage.

In this embodiment, the first wiring layer 26 is provided with the extending portion 26E. Whereby, as shown in FIG. 15, the parasitic capacitance Cmetal is subdivided into a parasitic capacitance component CmetalA between the first wiring layer 26 and the gate electrode 23 and a parasitic capacitance CmetalB between the first wiring layer 26 and an external wiring line. Its equivalent circuit is shown in FIG. 16, wherein the parasitic capacitance CmetalA is connected in parallel with the inherent capacitance C of the capacitor 532, 542 at a portion between the terminals nodeIN and nodeOUT, and thus acts to increase the capacitance C of capacitor 532, 542. On the other hand, the parasitic capacitance CmetalB is connected between the terminal nodeIN and ground potential Vss in a similar way to the parasitic capacitance Cpn stated supra; thus, it does not give any influence on the potential of the terminal nodeOUT. Consequently, according to this embodiment, it is possible to permit the potential of terminal nodeOUT to swing between VCC and 2Vcc in a design-expected manner.

As apparent from the foregoing, according to this embodiment, there is obtainable an effect which follows: it is possible to allot the parasitic capacitance occurring between the external wiring line Lo and the gate electrode 23 to an increase in inherent capacitance C, while at the same time eliminating bad influence on the circuit characteristics.

Figure 17:
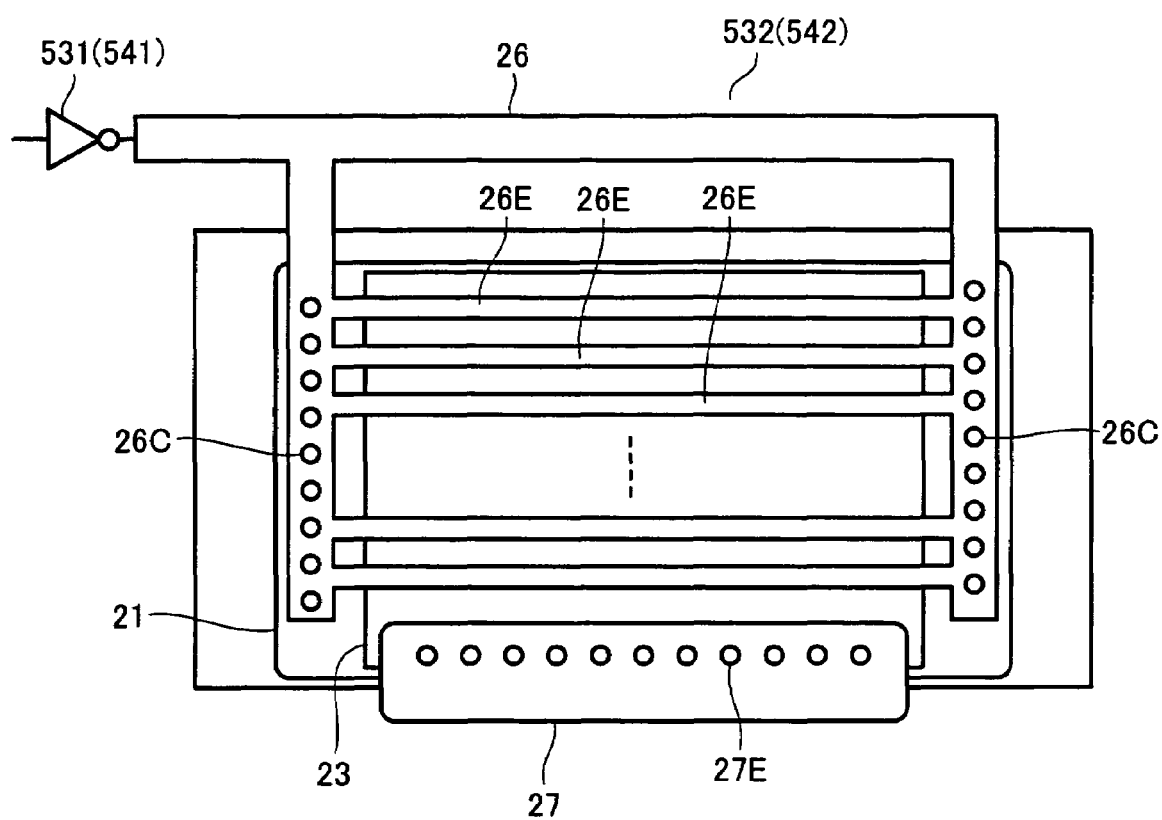
FIG. 17 shows a plan view of this capacitor in accordance with the second embodiment.

FIG. 17 shows a plan view of a capacitor 532 in accordance with this second embodiment. As shown in FIG. 17, the first wiring layer 26 is connected by a contact 26C to a contact layer 21C, with the extend portion 26E being arranged to be a grid or ladder-like electrode that is formed to overlie and cover the gate electrode 23. As an alternative approach to the use of such ladder-like shape, it is also possible to design the extend portion 26E to have a rectangular shape which buries an almost entire surface of the gate electrode 23. The capacitor 542 may also be arranged in substantially the same way.

Figure 18:
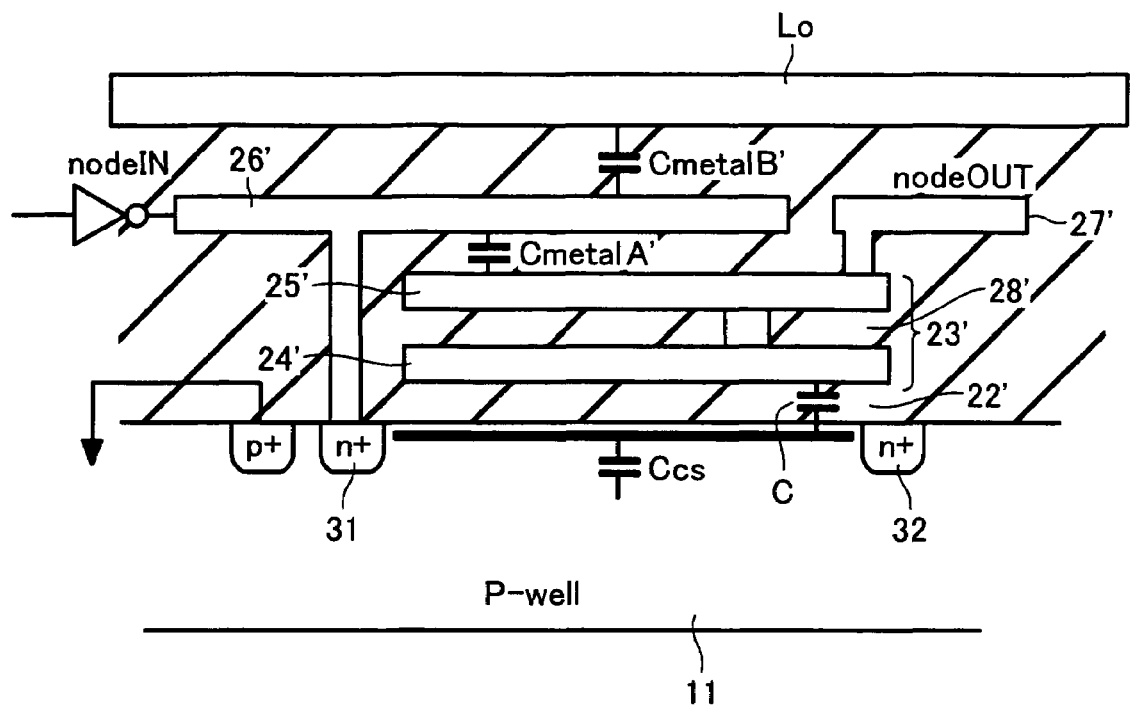
FIG. 18 shows a detailed structure of a capacitor in accordance with a third embodiment.
Figure 19:
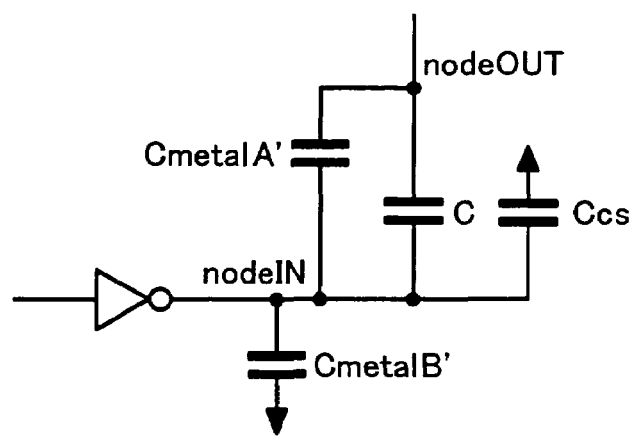
FIG. 19 is an equivalent circuit diagram of FIG. 18.

Next, a third embodiment of the invention will be explained with reference to FIGS. 18 and 19. In this embodiment, MOS capacitors such as those shown in FIG. 18 are utilized as the capacitors 532 and 542 within the booster circuits. In FIGS. 18-19, those parts or components that are similar to the MOS capacitors shown in FIGS. 13-14 are denoted by the same reference characters, with a detailed explanation omitted herein.

In this embodiment, a first wiring layer 26' that is connected to a diffusion layer 31 has an extending portion 26E' which is formed to overlie and cover a gate electrode 26' (refer to FIG. 18) in a similar way to the second embodiment. This extend portion 26E' divides a parasitic capacitance Cmetal' (see FIG. 13) into a parasitic capacitance component CmetalA' between the first wiring layer 26 and the gate electrode 23 and a parasitic capacitance CmetalB' between the first wiring layer 26 and an external wiring line. The parasitic capacitance CmetalA' is connected in parallel to the inherent capacitance C of the capacitor 531 or 541 (see FIG. 19) so that it contributes to an increase in inherent capacitance C. On the contrary, the parasitic capacitance CmetalB' takes place between the terminal nodeIN and ground potential in a similar way to the parasitic capacitance Ccs. Thus it does not affect the potential of terminal nodeOUT in any way. As has been described above, the parasitic capacitance Ccs is larger than the parasitic capacitance Cpn (FIG. 16). Thus it is possible to precisely control the terminal nodeOUT, although power consumption becomes larger than that in the second embodiment.

Although the present invention has been particularly shown and described with reference to embodiments thereof, the invention should not exclusively be limited thereto, and various changes, additions or replacements may be made therein without departing from the spirit and scope of the invention.

What is claimed is:

1. A non-volatile semiconductor memory device comprising:
   a memory cell array with memory cells arranged therein, each memory cell having a floating gate formed on a semiconductor substrate of a first conductivity type via an interlayer dielectric film, and a control gate formed above said floating gate via an interlayer dielectric layer, and
   a booster circuit boosting a power source voltage to a certain boosted voltage,
   wherein said booster circuit comprises:
   a well capacitor formed of a well of a second conductivity type formed at said semiconductor substrate of a first conductivity type, and a gate electrode formed on said well via a dielectric film,
   and wherein a wiring layer electrically connected to said well switched between a first potential and a second potential passes above said gate electrode.

2. The non-volatile semiconductor memory device according to claim 1, wherein said booster circuit includes a plurality of capacitors connected in series, and at least part of said plurality of capacitors are formed of said well capacitor.

3. The non-volatile semiconductor memory device according to claim 2, wherein said booster circuit comprises:
   a diode-coupled charge transfer transistor connected between a power source voltage terminal and a output voltage terminal,
   a first capacitor with a first and second terminal, said first terminal being connected to said to said charge transfer transister, and
   a clock signal supply circuit supplying a clock signal to said second terminal of said first capacitor, said clock signal supply circuit including a plurality of second capacitors connected in series,
   and wherein at least part of said second capacitors and said first capacitor are formed of said well capacitor.

4. The non-volatile semiconductor memory device according to claim 1,
   wherein the portion of the wiring layer that is formed to overlie said gate electrode is a grid-like wiring layer with a certain pitch formed above said gate electrode.

5. The non-volatile semiconductor memory device according to claim 1, wherein said gate electrode of said well capacitor has the same structure as said floating gate of said memory cell.

6. The non-volatile semiconductor memory device according to claim 1, wherein said gate electrode of said well capacitor and said floating gate of said memory cell each has a two-layer structure.

7. The non-volatile semiconductor memory device according to claim 6, wherein said two-layer structure is of a poly-silicon layer as the lower layer, and a tungsten silicide layer as the upper layer.

8. The non-volatile semiconductor memory device according to claim 1, wherein said memory cell array is formed by arranging NAND type cells in matrix, each NAND cell including a plurality of said memory cells connected in series, and a select transistors on both ends thereof.

9. The non-volatile semiconductor memory device according to claim 1, wherein said interlayer dielectric layer is an ONO films having a three-layer structure of a silicon oxide layer, a silicon nitride layer, and a silicon oxide layer.

* * * * *